(12) United States Patent
Van Zyl

(10) Patent No.: US 11,450,510 B2
(45) Date of Patent: *Sep. 20, 2022

(54) INTER-PERIOD CONTROL SYSTEM FOR PLASMA POWER DELIVERY SYSTEM AND METHOD OF OPERATING SAME

(71) Applicant: Advanced Energy Industries, Inc., Fort Collins, CO (US)

(72) Inventor: Gideon Van Zyl, Fort Collins, CO (US)

(73) Assignee: Advanced Energy Industries, Inc., Fort Collins, CO (US)

(*) Notice: Subject to any disclaimer, the term of this patent is extended or adjusted under 35 U.S.C. 154(b) by 0 days.

This patent is subject to a terminal disclaimer.

(21) Appl. No.: 17/113,088

(22) Filed: Dec. 6, 2020

(65) Prior Publication Data

US 2021/0118650 A1 Apr. 22, 2021

Related U.S. Application Data

(63) Continuation of application No. 16/028,131, filed on Jul. 5, 2018, now Pat. No. 10,861,677.

(Continued)

(51) Int. Cl.
*H01J 37/32* (2006.01)
*H03H 7/40* (2006.01)

(52) U.S. Cl.
CPC .. *H01J 37/32183* (2013.01); *H01J 37/32128* (2013.01); *H03H 7/40* (2013.01)

(58) Field of Classification Search
None
See application file for complete search history.

(56) References Cited

U.S. PATENT DOCUMENTS 5,325,019 A * 6/1994 Miller ............... H01J 37/32082
315/111.21
6,633,017 B1 * 10/2003 Drummond ............ H05H 1/46
219/121.57

(Continued)

FOREIGN PATENT DOCUMENTS

CN 102985996 A 3/2013
JP S61245202 A 10/1986

(Continued)

OTHER PUBLICATIONS

KIPO, "Notice of Grounds for Rejection Regarding Korean Patent Application No. 10-2020-7001574", dated May 14, 2021, p. 18, Published in: KR.

(Continued)

*Primary Examiner* — Srinivas Sathiraju
(74) *Attorney, Agent, or Firm* — Neugeboren O'Dowd PC

(57) ABSTRACT

A generator produces output such as delivered power, voltage, current, forward power etc. that follows a prescribed pattern of output versus time where the pattern repeats with a repetition period by controlling sections of the pattern based on measurements taken one or more repetition periods in the past. A variable impedance match network may control the impedance presented to a radio frequency generator while the generator produces the output that follows the prescribed pattern of output versus time where the pattern repeats with a repetition period by controlling variable impedance elements in the match during sections of the pattern based on measurements taken one or more repetition periods in the past.

23 Claims, 9 Drawing Sheets

Related U.S. Application Data

(60) Provisional application No. 62/529,963, filed on Jul. 7, 2017.

(56) References Cited

U.S. PATENT DOCUMENTS

| | | | | |
|---|---|---|---|---|
| 6,700,092 | B2* | 3/2004 | Vona, Jr. | H01J 37/32146 219/121.48 |
| 7,115,185 | B1* | 10/2006 | Gonzalez | H01J 37/321 315/111.41 |
| 7,839,223 | B2 | 11/2010 | Van Zyl et al. | |
| 7,872,523 | B2* | 1/2011 | Sivakumar | H03F 3/2176 330/10 |
| 8,576,013 | B2* | 11/2013 | Coumou | H03F 1/32 330/305 |
| 8,736,377 | B2* | 5/2014 | Rughoonundon | H03K 4/026 330/296 |
| 8,742,669 | B2* | 6/2014 | Carter | H01J 37/32183 315/111.71 |
| 8,773,019 | B2* | 7/2014 | Coumou | H03F 3/211 315/111.21 |
| 8,847,561 | B2 | 9/2014 | Karlicek et al. | |
| 8,952,765 | B2* | 2/2015 | Fisk, II | H03B 5/1237 330/296 |
| 9,088,267 | B2* | 7/2015 | Blackburn | H03H 7/40 |
| 9,093,853 | B2* | 7/2015 | Schatz | H02J 50/40 |
| 9,210,790 | B2* | 12/2015 | Hoffman | H01J 37/3299 |
| 9,225,229 | B2* | 12/2015 | Abe | H02M 1/08 |
| 9,294,100 | B2* | 3/2016 | Van Zyl | H03L 7/26 |
| 9,355,822 | B2* | 5/2016 | Yamada | H01J 37/32155 |
| 9,509,266 | B2* | 11/2016 | Coumou | H03G 1/00 |
| 9,515,633 | B1* | 12/2016 | Long | H03H 7/48 |
| 9,536,713 | B2* | 1/2017 | Van Zyl | H01J 37/32935 |
| 9,544,987 | B2* | 1/2017 | Mueller | H01J 37/32146 |
| 9,595,424 | B2* | 3/2017 | Marakhtanov | H01F 38/14 |
| 9,680,217 | B2* | 6/2017 | Ali | H01Q 1/50 |
| 9,773,644 | B2* | 9/2017 | Van Zyl | H03F 3/189 |
| 9,812,305 | B2* | 11/2017 | Pelleymounter | H01J 37/3467 |
| 9,852,890 | B2* | 12/2017 | Mueller | H01J 37/32174 |
| 9,947,514 | B2* | 4/2018 | Radomski | H01J 37/321 |
| 9,997,325 | B2* | 6/2018 | Hosch | H01J 37/32935 |
| 10,049,857 | B2 | 8/2018 | Fisk, II et al. | |
| 10,109,460 | B2* | 10/2018 | Liu | H01J 37/32183 |
| 10,194,518 | B2* | 1/2019 | Van Zyl | H01J 37/32082 |
| 10,217,609 | B2* | 2/2019 | Fisk, II | H01J 37/32146 |
| 10,504,744 | B1* | 12/2019 | Yanagawa | H01L 21/31116 |
| 10,607,813 | B2* | 3/2020 | Fairbairn | C23C 16/509 |
| 10,741,363 | B1* | 8/2020 | Burry | H03H 11/28 |
| 10,811,228 | B2 | 10/2020 | Van Zyl et al. | |
| 10,861,677 | B2* | 12/2020 | Van Zyl | H03H 7/40 |
| 10,896,807 | B2* | 1/2021 | Fairbairn | C23C 16/52 |
| 11,177,115 | B2* | 11/2021 | Leray | H01L 21/67069 |
| 2005/0264218 | A1 | 12/2005 | Dhindsa et al. | |
| 2007/0107844 | A1* | 5/2007 | Bullock | H01J 37/32174 156/345.28 |
| 2008/0179948 | A1* | 7/2008 | Nagarkatti | H03F 3/195 307/18 |
| 2009/0237170 | A1 | 9/2009 | Van Zyl et al. | |
| 2010/0026186 | A1* | 2/2010 | Forrest | H01J 37/32935 315/111.21 |
| 2010/0171427 | A1* | 7/2010 | Kirchmeier | G01R 21/06 315/111.21 |
| 2010/0270141 | A1* | 10/2010 | Carter | H01J 37/3299 422/105 |
| 2010/0276273 | A1* | 11/2010 | Heckman | H01J 37/3299 204/298.04 |
| 2011/0248633 | A1* | 10/2011 | Nauman | C23C 14/548 315/246 |
| 2012/0252141 | A1 | 10/2012 | Sundararajan et al. | |
| 2013/0002136 | A1 | 1/2013 | Blackburn et al. | |
| 2013/0169359 | A1 | 7/2013 | Coumou | |
| 2013/0320853 | A1* | 12/2013 | Carter | H01J 37/321 315/111.51 |
| 2014/0239813 | A1 | 8/2014 | Van Zyl et al. | |
| 2014/0306754 | A1 | 10/2014 | Coumou et al. | |
| 2015/0162168 | A1* | 6/2015 | Oehrlein | H01J 37/32146 216/37 |
| 2015/0250046 | A1 | 9/2015 | Habu | |
| 2016/0163514 | A1* | 6/2016 | Fisk, II | H01J 37/32174 315/111.21 |
| 2016/0276138 | A1 | 9/2016 | Van Zyl | |
| 2017/0005533 | A1 | 1/2017 | Zeine et al. | |
| 2017/0062187 | A1* | 3/2017 | Radomski | H01J 37/321 |
| 2017/0310008 | A1* | 10/2017 | White | H01Q 5/335 |
| 2017/0365907 | A1* | 12/2017 | Kapoor | H03H 7/40 |
| 2018/0077788 | A1* | 3/2018 | Van Zyl | H01J 37/32935 |
| 2018/0167043 | A1* | 6/2018 | Van Zyl | H03K 17/693 |
| 2019/0013182 | A1* | 1/2019 | Van Zyl | H01J 37/32174 |
| 2019/0157040 | A1* | 5/2019 | Fairbairn | C23C 16/52 |
| 2020/0043703 | A1 | 2/2020 | French et al. | |
| 2020/0203128 | A1* | 6/2020 | Fairbairn | H01J 37/3299 |
| 2020/0411289 | A1* | 12/2020 | Radomski | H01J 37/32183 |
| 2021/0118649 | A1* | 4/2021 | Huh | H01J 37/32183 |
| 2021/0118650 | A1* | 4/2021 | Van Zyl | H03H 7/40 |
| 2021/0134562 | A1* | 5/2021 | Fairbairn | C23C 16/509 |
| 2021/0166917 | A1* | 6/2021 | Van Zyl | H03H 7/40 |
| 2021/0249228 | A1* | 8/2021 | Van Zyl | H01J 37/3299 |
| 2021/0287880 | A1* | 9/2021 | Van Zyl | H01J 37/32146 |

FOREIGN PATENT DOCUMENTS

| | | |
|---|---|---|
| JP | 2002184598 A | 6/2002 |
| JP | 2006-286254 A | 10/2006 |
| JP | 2008-501224 A | 1/2008 |
| JP | 2009-514176 A | 4/2009 |
| JP | 2010521041 A | 6/2010 |
| JP | 2010-219026 A | 9/2010 |
| JP | 2013176040 A | 9/2013 |
| KR | 10-2014-0000172 A | 1/2014 |
| KR | 10-2014-0130009 A | 11/2014 |
| TW | 1562189 B | 12/2016 |
| TW | 201719711 A | 6/2017 |
| TW | I585814 B | 6/2017 |
| WO | 2004/012220 A2 | 2/2004 |
| WO | 2007/053569 A1 | 5/2007 |
| WO | 2019/010312 A1 | 1/2019 |
| WO | WO-2019010312 A1 * | 1/2019 ........ H01J 37/32045 |

OTHER PUBLICATIONS

Remy, Jerome, "Supplemental Extended Search Report Regarding European Patent Application No. 18827671.1", dated Feb. 9, 2021, p. 10, Published in: EP.

Japanese Patent Office, "Office Action Issued in Japanese Patent Application No. 2020-500181", dated Feb. 2, 2021, Published in: JP.

TIPO, "Official Action From the Intellectual Property Office of Taiwan Regarding Application No. 107123277", dated Jul. 8, 2020, p. 19, Published in: TW.

Sathiraju, Srinivas, "Final Office Action Regarding U.S. Appl. No. 16/028,131", dated Mar. 10, 2020, p. 36, Published in: US.

Sathiraju, Srinivas, "Office Action Regarding U.S. Appl. No. 16/028,131", dated May 31, 2019, p. 29, Published in: US.

Sathiraju, Srinivas, "Office Action Regarding U.S. Appl. No. 16/028,131", dated Oct. 4, 2019, p. 27, Published in: US.

Sathiraju, Srinivas, "Office Action Regarding U.S. Appl. No. 16/028,131", dated Nov. 20, 2018, p. 24, Published in: US.

Thomas, Shane, "International Search Report and Written Opinion Regarding International Application No. PCT/US2018/040930", dated Nov. 1, 2018, p. 15, Published in: US.

First Office Action received for Chinese Patent Application Serial No. 201880045502.2 dated Oct. 11, 2021, 22 pages.

International Search Report and Written Opinion received for International PCT Application Serial No. PCT/US2022/016291 dated Apr. 27, 2022, 11 pages.

Leva et al., "Periodic Event-based Control with Past Measurements Transmission", IEEE, 2017, 8 pages.

Notice of Grounds for Rejection received for Korean Patent Application Serial No. 10-2022-7004931 dated Mar. 22, 2022, 18 pages.

(56) References Cited

OTHER PUBLICATIONS

International Search Report and Written Opinion received for International PCT Application Serial No. PCT/US2022/014915 dated Mar. 21, 2022, 11 pages.
Maurice, C. Y. M., "Inductively Coupled Plasmas: Ion Dynamics and Interactions with Bone Tissue", Technische Universiteit Eindhoven, pp. 203, 2003.
Notice of Allowance received for U.S. Appl. No. 16/028,131 dated Aug. 3, 2020, 31 pages.
Notice of Allowance received for U.S. Appl. No. 16/028,131 dated Aug. 27, 2020, 17 pages.

* cited by examiner

INTER-PERIOD CONTROL SYSTEM FOR PLASMA POWER DELIVERY SYSTEM AND METHOD OF OPERATING SAME

CLAIM OF PRIORITY UNDER 35 U.S.C. § 120

The present Application for Patent is a Continuation of patent application Ser. No. 16/028,131 entitled "INTER-PERIOD CONTROL SYSTEM FOR PLASMA POWER DELIVERY SYSTEM AND METHOD OF OPERATING THE SAME," filed Jul. 5, 2018, pending, and assigned to the assignee hereof and hereby expressly incorporated by reference herein. This application also claims priority under 35 U.S.C. § 119(e) from U.S. Patent Application No. 62/529, 963, filed Jul. 7, 2017 entitled "INTER-PERIOD CONTROL SYSTEM FOR PLASMA POWER DELIVERY SYSTEM AND METHOD OF OPERATING THE SAME," the entire contents of which is incorporated herein by reference for all purposes.

TECHNICAL FIELD

Aspects of the present disclosure relate to improved methods and systems for controlling a power delivery system, and particularly for controlling a plasma power delivery system.

BACKGROUND

Plasma processing systems are used to deposit thin films on a substrate using processes such as chemical vapor deposition (CVD) and physical vapor deposition (PVD) as well to remove films from the substrate using etch processes. The plasma is often created by coupling radio frequency (RF) or direct current (DC) generators to a plasma chamber filled with gases injected into the plasma chamber at low pressure. Typically, a generator delivers RF power to an antenna in the plasma chamber, and power delivered at the antenna ignites and sustains a plasma. In some instances, the RF generator is coupled to an impedance matching network that may match the plasma impedance to a desired impedance, typically 50Ω, at the generator output. DC power is typically coupled to chamber via one or more electrodes. The generator alone or the generator in combination with other pieces of equipment, such as the impedance matching network, other generators coupled to the same plasma, cables, etc., constitute a plasma power delivery system.

Modulation of the power delivered to the plasma system is often required. Most modulation schemes are repetitive, i.e., the same modulation waveform is repeated at a waveform repetition rate. The associated waveform repetition period is equal to one divided by the waveform repetition rate. The ability to follow a prescribed modulation waveform using a traditional control scheme requires high bandwidth from the controller and ultimately from the measurement system. Many plasma systems have power applied to the plasma at different frequencies. The nonlinear nature of the plasma load creates intermodulation products that can interfere with a generator's measurements system. Thus, it is sometimes advantageous to use a narrowband measurement system to limit such interference. In many applications, power delivered to the plasma load is not the only parameter that is being controlled. For example, in RF power delivery systems, the impedance presented to the generator by the plasma load can be controlled, either through controlling the frequency of the generator output or through controlling a variable impedance match network between the generator and the plasma load. In some cases, generator source impedance may also be controlled. Tracking and controlling power in light of these various issues presents ever greater control challenges.

It is with these observations in mind, among others, that aspects of the present disclosure were conceived.

SUMMARY

According to one embodiment, a generator produces output such as delivered power, voltage, current, forward power etc. that follows a prescribed pattern of output versus time where the pattern repeats with a repetition period by controlling sections of the pattern based on measurements taken one or more repetition periods in the past. In one example, a power delivery system involves a generator that produces a repeating output pattern and a control element controls the repeating pattern based on a measurement of a value of the repeating pattern taken a period prior to a current period. The control element may further control the repeating output pattern based on the measurement of the repeating pattern taken a period prior to the current period combined with a measurement of a value of the repeating pattern during a current period. The repeating output pattern may follow a prescribed pattern of output versus time wherein the prescribed pattern repeats with a repetition period, and wherein the measurement of the value of the repeating pattern taken a period prior to the current period occurs one or more repetition periods in the past.

According to yet another embodiment, a variable impedance match network controls the impedance presented to a RF generator while the generator produces output, such as delivered power, voltage, current, forward power, etc., that follows a prescribed pattern of output versus time where the pattern repeats with a repetition period by controlling variable impedance elements in the match during sections of the pattern based on measurements taken one or more repetition periods in the past. The generator may provide the delivered power, voltage, current, forward power, etc., to a plasma system in order to ignite and sustain a plasma, in various possible embodiments.

According to yet another embodiment, a generator produces output that follows a prescribed pattern of output versus time where the pattern repeats with a repetition period by controlling sections of the pattern based on measurements taken one or more repetition periods in the past; and combining this controller with an intra-period controller that calculates the control output based on measurements taken less than a repetition period in the past.

According to yet another embodiment, a variable impedance match network controls the impedance presented to a RF generator while the generator produces output, such as delivered power, voltage, current, forward power, etc., that follows a prescribed pattern of output versus time where the pattern repeats with a repetition period by controlling variable impedance elements in the match during sections of the pattern based on measurements taken one or more repetition periods in the past; and combining this controller with an intra-period controller that calculates the control of the variable impedance elements in the match based on measurements taken less than a repetition period in the past.

According to another embodiment, a generator produces output that follows a prescribed pattern of output versus time where the pattern repeats with a repetition period by controlling sections of the pattern based on measurements taken one or more repetition periods in the past while at the same time adjusting another parameter such as generator output frequency or variable impedance elements contained in the generator or in a variable impedance matching network coupled between the generator and the plasma based on measurements taken one or more repetition periods in the past where the correlation between the control inputs such as power control and generator frequency and control outputs such as delivered power and impedance presented to the generator is determined and used by the control system.

According to yet another embodiment, a generator produces output that follows a prescribed pattern of output versus time where the pattern repeats with a repetition period by controlling a section of the pattern based on measurements taken for the same section one or more repetition periods in the past; as well as such measurements for other sections in the pattern by perturbing the control input, determining the response to the perturbation, and using the response to the perturbation to compensate for coupling between adjacent or closely located time periods in the waveform.

BRIEF DESCRIPTION OF THE DRAWINGS

The various features and advantages of the technology of the present disclosure will be apparent from the following description of particular embodiments of those technologies, as illustrated in the accompanying drawings. It should be noted that the drawings are not necessarily to scale; however the emphasis instead is being placed on illustrating the principles of the technological concepts. Also, in the drawings the like reference characters may refer to the same parts throughout the different views. The drawings depict only typical embodiments of the present disclosure and, therefore, are not to be considered limiting in scope.

DETAILED DESCRIPTION

Figure 1A:
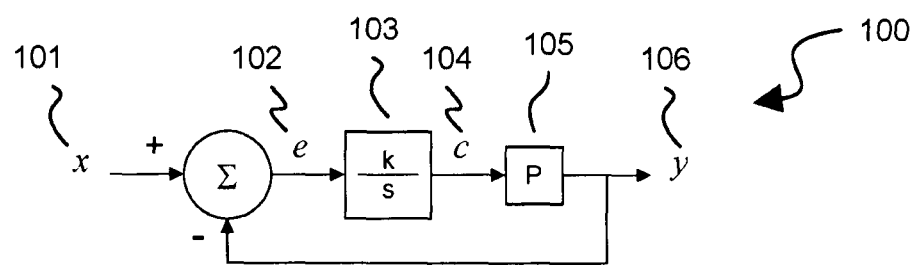
FIG. 1A illustrates a simple analog intra-period.

Embodiments of the present disclosure provide a plasma power delivery system that produces an output, such as delivered power, voltage, current, and forward power, that follows a prescribed pattern of output versus time where the pattern repeats with a repetition period by controlling sections of the pattern based on measurements taken one or more repetition periods in the past as opposed to within the current period. Compared to a conventional controller, such an inter-period controller can reproduce output more accurately utilizing a lower bandwidth measurement and control system. The benefits provided by the inter-period controller can be advantageous in various contexts including in the presence of plasma generated mixing and intermodulation products. In additional embodiments, the inter-period controller can be combined with a conventional intra-period controller. In additional embodiments, parameters, such as generator output frequency, may be adjusted together with the main output based on measurements taken one or more repetition periods in the past where the correlation between the control inputs, such as power control and generator frequency, and control outputs, such as delivered power and impedance presented to the generator are determined and used by the control system. In additional embodiments, a generator produces output that follows a prescribed pattern of output versus time where the pattern repeats with a repetition period by controlling a section of the pattern based on measurements taken for the same section one or more repetition periods in the past; as well as such measurements for other sections in the pattern by perturbing the control input, determining the response to the perturbation, and using the response to the perturbation to compensate for coupling between adjacent or closely located time periods in the waveform.

While primarily described with reference to a controller for a generator, aspects of the present disclosure are applicable to switch mode power supplies, and controllers for the same, which may be used in eV source applications such as to provide a bias to a substrate as part of an overall power delivery system, as well as other substrate biasing schemes. The controller and control schemes discussed herein may also be used to control variable impedance elements (such as vacuum variable capacitors or switched variable reactance elements) of impedance matching networks. In such instances, aspects of the present disclosure may or may not also be used in the controlling of an RF supply to the impedance matching network as part of the overall power delivery system. The controller may reside in any part of the power delivery system (e.g., in the generator or in the matching network) and may or may not receive information from and control other parts of the power delivery system. For example, a controller residing in the generator may control both a generator and a match that are part of the power delivery system with information obtained only from the generator, only from the match or from both the generator and the match. The controller and control schemes discussed herein may also be used in other systems with or without delivering power in a plasma power delivery environment.

Figure 1B:
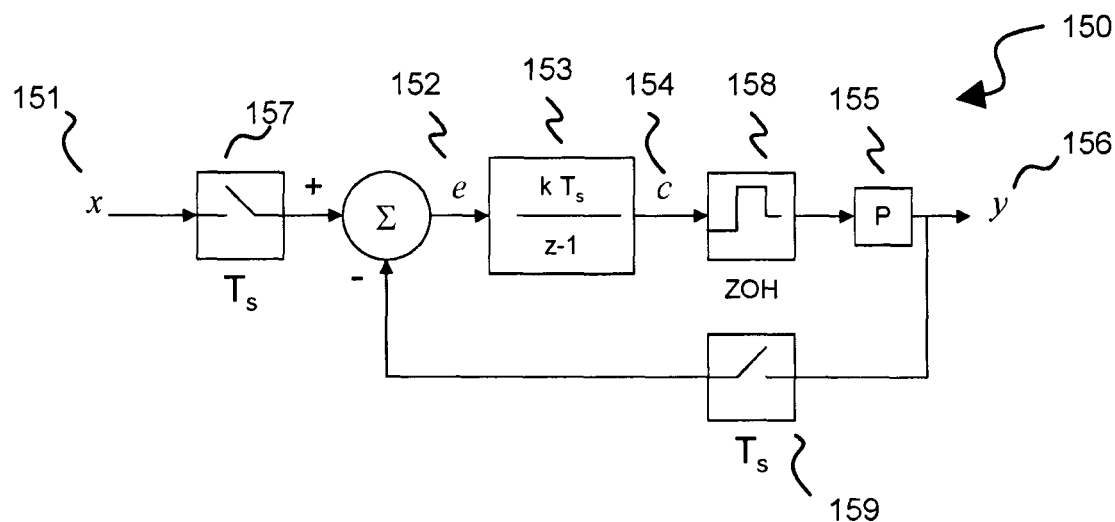
FIG. 1B illustrates a simple digital intra-period control systems that may be used to control a plasma power delivery system.

FIG. 1A (prior art) illustrates a simple analog intra-period, and FIG. 1B (prior art) illustrates a simple digital intra-period control systems that may be used to control a plasma power delivery system. In FIG. 1A the difference between an input 101 and output 106 produces an error signal 102 that a controller 103 uses to produce a control input 104 to a plant 105. In this illustration, the controller is a simple integrator with a gain of k. In an actual implementation, the control input 104, c, may be a drive level to a power amplifier, and the plant 105, P, a power amplifier. To illustrate the performance differences between this controller and the disclosed inter-period controller, the plant 105, P, is a unity gain block, i.e. y=c. With these assumptions, the loop gain has unity gain at k rad/s or k/(2π) Hz, the time constant of the system step response is 1/k s and the integral of the impulse response of the system reaches 63.2% (1-1/e) in 1/k s. In FIG. 1B, an input 151 is sampled at a sampling rate of $1/T_s$ and digitized by a sampler 157. (In some applications the input is already a digital data stream and the sampler 157 is not present in the system.) The output 156 is sampled and digitized by a sampler 159 and the difference between the input and output produces an error signal 152 that a controller 153 uses to produce a control input 154 which is converted to an analog control signal by a digital to analog converter 158 which is fed to a plant 155. As for FIG. 1A, to illustrate the performance differences between this controller and the disclosed inter-period controller, the plant 105, P, is a unity gain block. The same statements regarding relationship between k and the unity gain frequency and response times hold as for the analog controller of FIG. 1A provided that k is much less than $2\pi/T_s$.

Figure 2A:
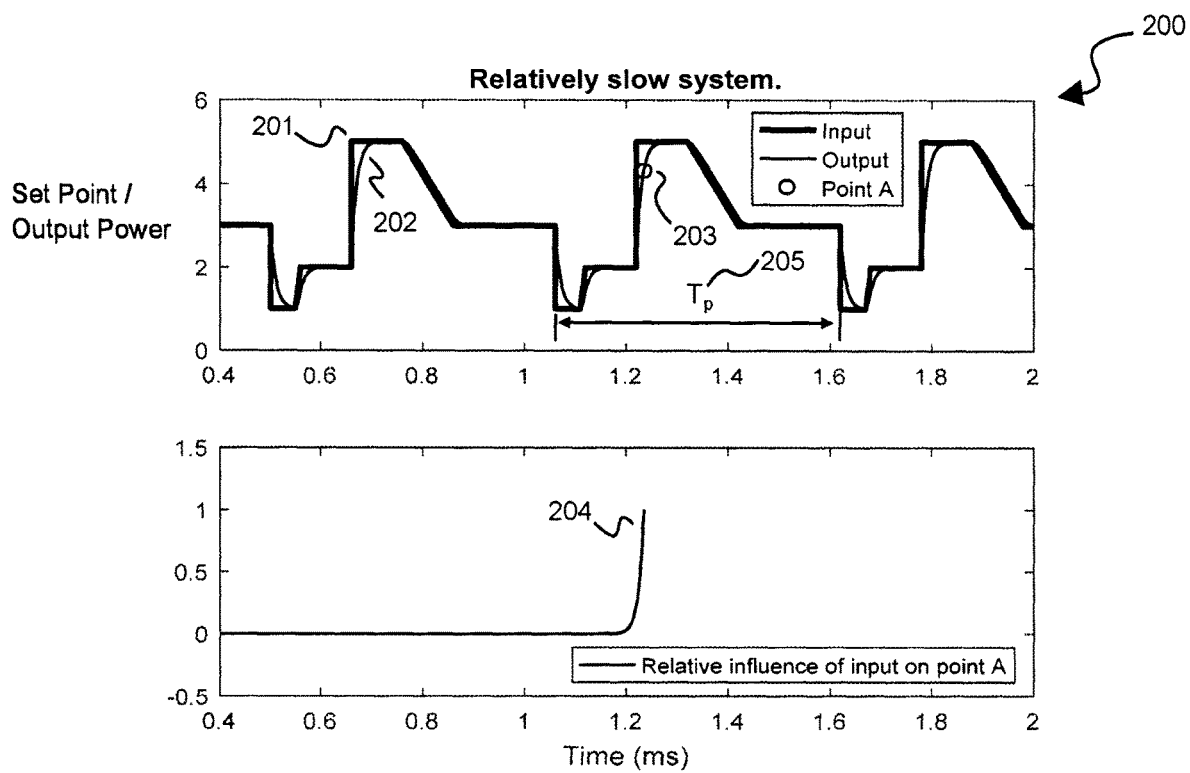
FIG. 2A illustrates the response of a relatively slow intra-period control system to a periodic input and FIG. 2B illustrates the response of a relatively fast intra-period control system to a periodic input.
Figure 2B:
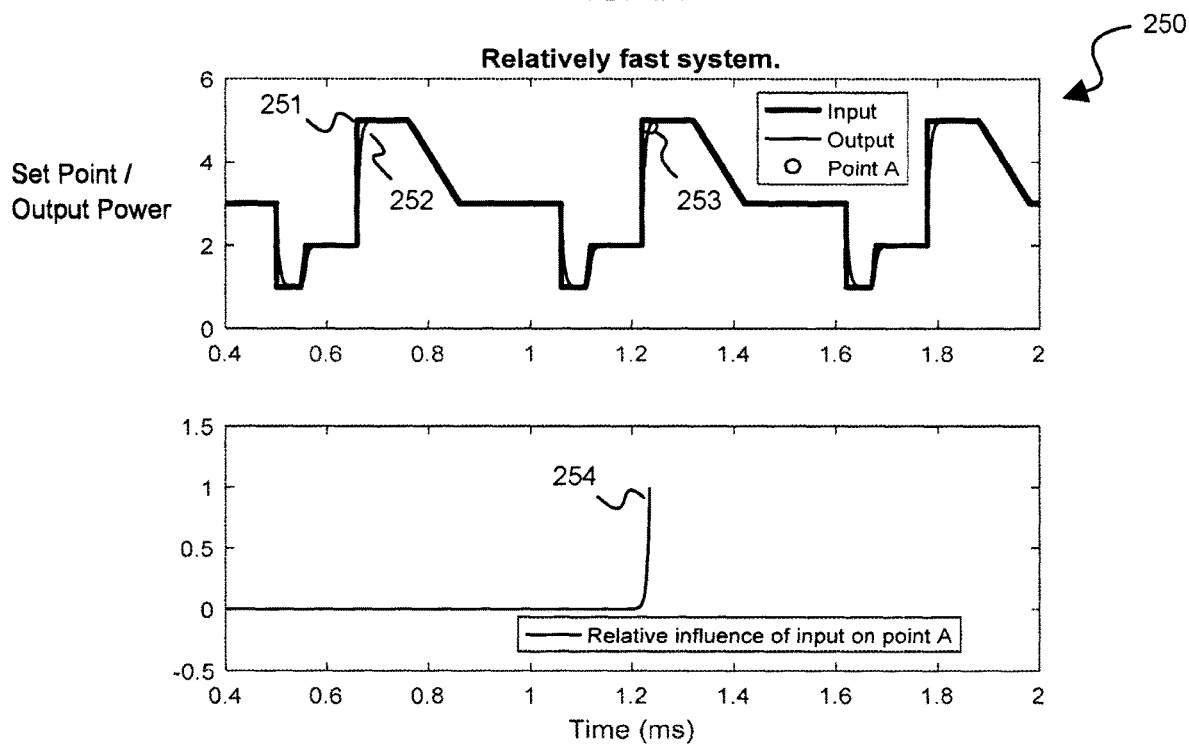

FIG. 2A (prior art) shows the response 200 of the simple intra-period controller such as shown in FIG. 1A or FIG. 1B to a periodic input with period $T_p$, 205. In this example a host of different set points (e.g., a set point power of 1, followed by 2, followed by 5, with a ramp to 3) defines one period of the input. The output, 202, follows the input, 201 with visible inaccuracy (where the output does not match the input set point). The time constant of the closed loop response for this illustration is 10 μs. The output at a given point, A, 203, can be obtained by multiplying the time shifted time reversed impulse response of the system with the input and integrating. The normalized time shifted time reversed impulse response of the unit, 204, shows that the output at point A, 203, is heavily influenced by the very recent past (within one time constant or 10 μs prior to point A), and almost not at all by events occurring earlier than 10 time constants prior to point A. To accommodate the changing set points within a pulse, the conventional controller must be very fast. As shown in FIG. 2B (prior art), speeding up the controller improves the ability of the output to follow the input accurately. The time constant of the closed loop response for this illustration is 5 μs. The response, 250, shows that the output, 252, follows the input, 251, more closely. The normalized time shifted time reversed impulse response 254 shows that the point A, 253, is now even more heavily influenced by the input in the very recent past.

In these conventional intra-period controllers, the error control is based on the measured value of the current output (within the period) against the set point. So, referring to FIG. 2A, for example, the measured value of the output at time 1.5 ms would be compared against the set point value at that same time to generate the error signal. Stated differently, the set point values are compared against the measured values during the current period to generate the error signal for the conventional intra-period controller. In contrast, an inter-period controller compares the measured value of the output one or more cycles in the past for a given set point and uses the past measured value at the set point to generate the current error signal and controller output. Referring again to FIG. 2A, for example, at time 1.5 ms with a set point of 3, the measured value at time 0.94 ms (which is one waveform repetition period of 0.56 ms earlier or that part of the preceding pulse that correlates with time 1.5 ms) with the same set point of 3 would be used by the controller to generate the error and output, as opposed to the measured value within the pulse at time 1.5 ms. Notably, the inter-period controller need not be nearly as fast because it relies on a measured value one cycle in the past as opposed to an immediately proximate value within the pulse.

In some examples, the pulse (e.g., the pulse over period Tp) is divided into multiple time periods, and the corresponding (same) output value in the same time period of the previous pulse is used for the error signal. Referring again to the example immediately above referring to using the measured value at time 0.94 ms of the first pulse for the error correction at time 1.5 ms of the following second pulse, the time period would encompass the specific value of 0.56 ms within some range. In one example, the time periods by which pulses are divided are such that any given time period does not encompass different set points, with the exception of sloped set point transitions.

In various implementations, the inter-period pulse information is stored in some form of memory such that it can be accessed and used by the controller for the error feedback of the succeeding pulse. Complicated pulses, such as with sloped set point transitions, and otherwise different set points may benefit from relatively smaller time period subdivisions of the pulse, and therefore may require relatively larger and faster memory. In specific examples, pulses with between a 100 ms and 10 μs period Tp may be subdivided into 1024 time slices, and output values for each slice stored for comparison to the measured valued in the same time slice of the subsequent pulse.

In some applications no error signal is generated. In impedance matching applications using an inter-period control scheme information about an impedance presented to a generator one or multiple periods, $T_p$, 205, in the past can be used to adjust variable impedance elements within the matching network at the present time. The information can be used to calculate adjustments to the variable impedance matching elements without first generating an error signal. In impedance matching applications the setpoint (e.g. 101, 151, 303, 351, 501) is generally constant, but there is a periodic disturbance of the load impedance that must be matched to a desired input impedance. Such a periodic disturbance can for example arise from delivering power to a plasma load that follows a prescribed pattern of output versus time where the pattern repeats with a repetition period. In such a case a synchronization signal from for example the power source providing the prescribed pattern of power can be provided to the matching network to assist the matching network in synchronizing with the repetitive waveform of the disturbance.

Figure 3A:
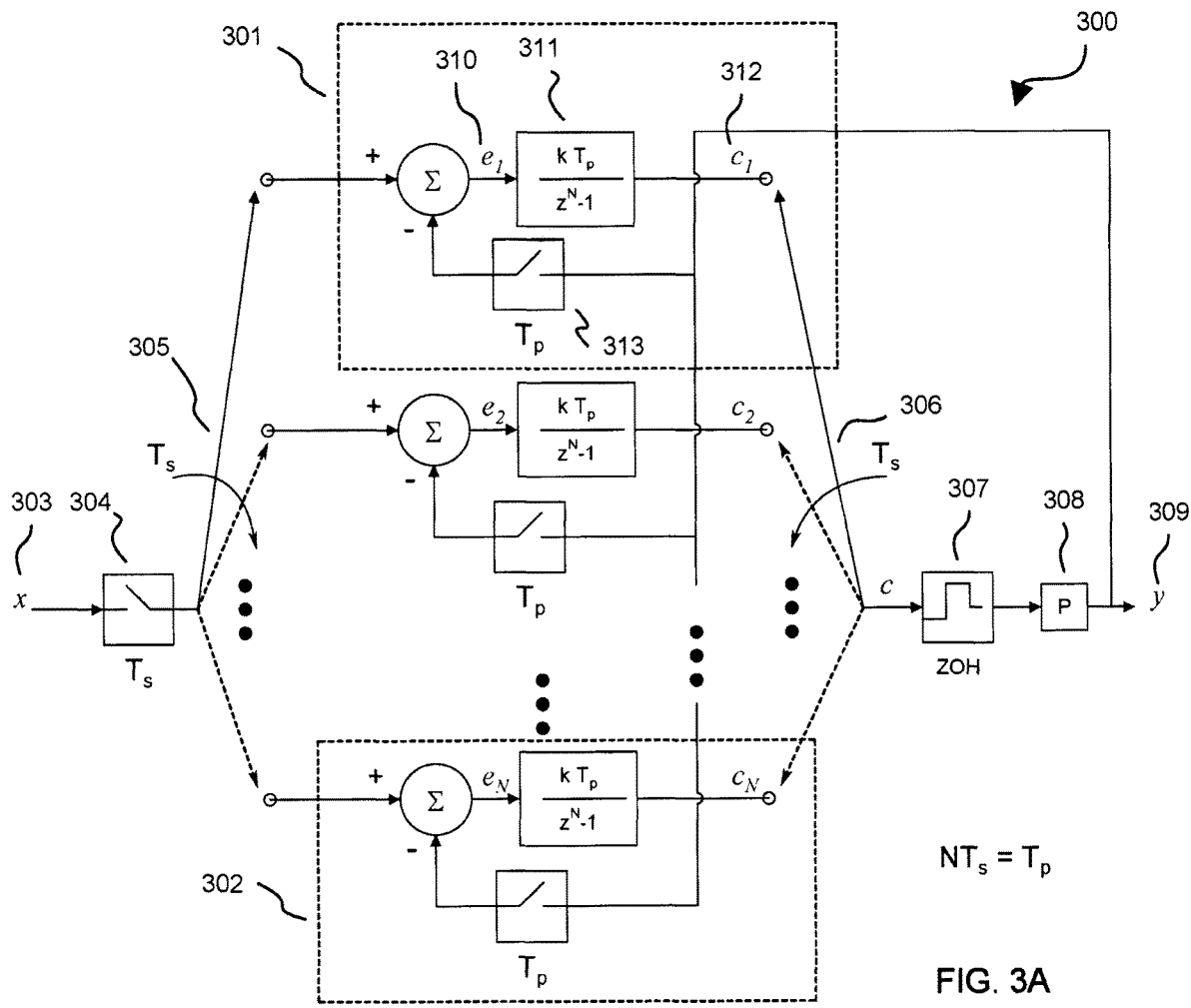
FIG. 3A and FIG. 3B illustrate block diagrams of example inter-period controllers that may be implemented in a plasma power delivery system according to embodiments of the present disclosure.
Figure 3B:
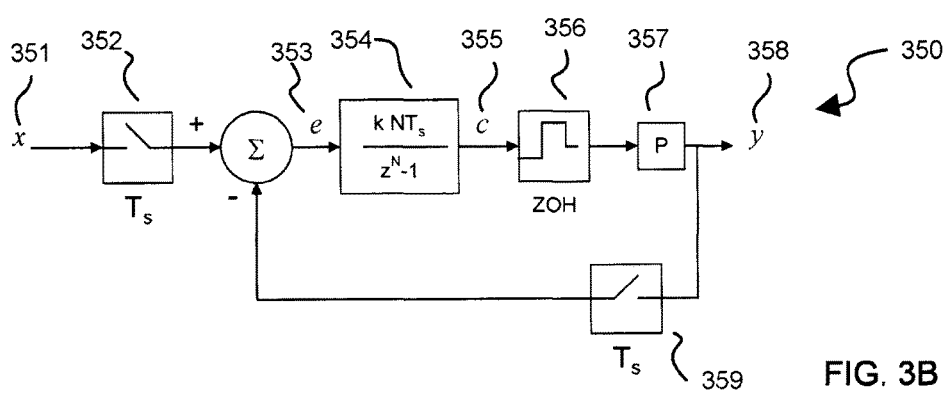

FIG. 3A illustrates a block diagram of one example of an inter-period controller 300 that may be implemented in a plasma power delivery system according to one embodiment of the present disclosure. FIG. 3B illustrates a block diagram of an alternate example implementation of an inter-period controller 350 that may be implemented in a plasma power delivery system according to another embodiment of the present disclosure. Some implementations of the inter-period controllers described herein may be considered multi-input-multi-output (MIMO) controllers. The controllers or more generally control elements may be implemented in hardware and software, with various possibly combinations of the same. The control element may be integrated with the generator or other device, or may be a separate component. In some applications the inter-period controller may reside in a different piece of equipment from what is being controlled. As an example, a controller connected to an impedance matching network may reside in the generator but control variable impedance elements in the impedance matching network. In such an application forward and reflected signals from a coupler may be obtained from a coupler residing in the generator, filtered in analog, digitized in an analog to digital converter, and processed to extract the impedance presented to the generator by the match by a microprocessor running a software program or by digital logic circuits implemented in, for example, an FPGA. The measurements can be stored in memory by a microprocessor or reconfigurable digital circuits residing in an FPGA. The memory containing samples of impedance measurements at different times can be processed using software running in a microprocessor or by an FPGA. The software or FPGA can use samples one or multiple waveform repetition periods in the past to implement an inter-period control scheme. To implement such a scheme information about past values of variable impedance elements in the match can also be used. The controller can then send control signals to the match to change variable impedance elements in the match. FIG. 3A implements the inter-period controller (providing an interleaved scheme) as a number, N, of controllers each running at the repetition period, $T_p$, of the input. The block 301 shows the first such controller and the block 302 shows the N-th such controller. The input, 303, is sampled and digitized by an analog to digital converter, 304, at a sampling rate of $1/T_s$. (The input may already exist as a data stream in which case the converter 304 is not used.) The sampled input is switched or routed to the controllers in turn by a switch, 305 so that each controller receives an updated input at a rate of $1/T_p$. The outputs of the controllers are routed to a common control input, c, by a switch 306. The control input is converted to analog by a digital to analog converter 307 and applied to the control input of a plant, P, 308. The output, y, 309, is sampled by each controller at a rate of $1/T_p$ by a sampler (313 for controller 301).

Each controller creates an error function (310 for controller 301) by subtracting the input from the sampled output. (Since the sampled output is delayed by a waveform period, $T_p$, this implements an inter-period controller.) The error function is integrated (by 311 for controller 301) producing an output (312 for controller 301). The number of controllers, N, and the sampling period $T_s$ is adjusted so that $NT_s=T_p$. To cater for situations where the repetition period of the input, $T_p$, may vary a few sampling periods, extra controllers may be utilized. For example, there may be N+3 controllers to deal with a $T_p$ that can vary three sampling periods. When an extra control section is not updated due to a shorter than maximum $T_p$, the state of the last updated controller can be copied to the extra control section.

FIG. 3B shows an alternate implementation of an inter-period controller 350 in accordance with an embodiment of the present disclosure. The input 351 is sampled and digitized by an analog to digital converter, 352, at a sampling rate of $1/T_s$. (The input may already exist as a data stream in which case the converter 352 is not used.) The output 358 is sampled and digitized by an analog to digital converter 359. (The output may be a digital data stream derived from a measurement of the output in which case the analog to digital converter may not be implemented as shown.) An error function 353 is obtained by subtracting the input from the output. The controller 354 generates the control input to the plant, c, 355, from the values of the control input to the plant, c, 355, and the error function, e, 353, one period of the input, $T_p$ ago. This is significantly different from a conventional intra-period controller as will be shown infra. The control input to the plant is converted to an analog signal by a digital to analog converter, 356, and applied to a plant, 357. As for the controller 300, provision can be made to deal with situations where the repetition period of the input, $T_p$, may vary a few sampling periods. In this case, N is allowed to vary based on the number of sampling periods $T_s$ that fit in the previous period of the input $T_p$.

Figure 4A:
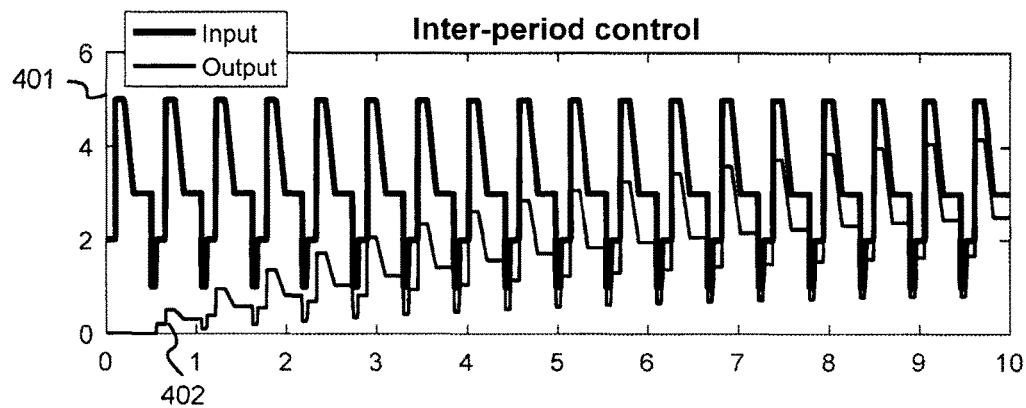
FIG. 4A-FIG. 4D illustrate the response of an example inter-period controller to a periodic input.
Figure 4B:
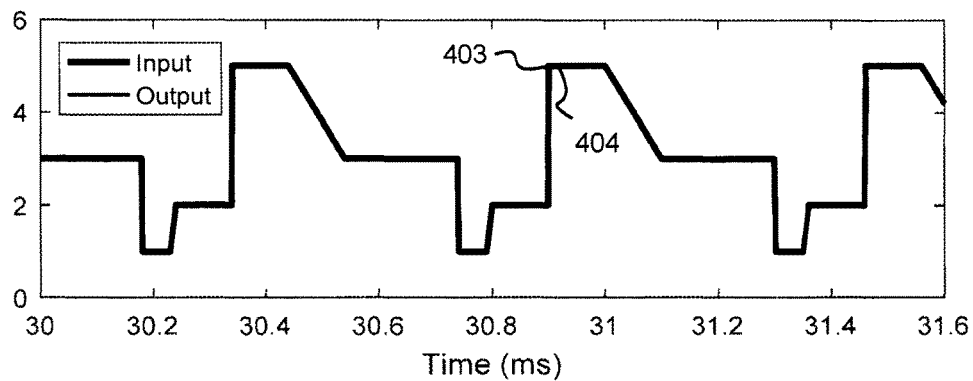
Figure 4C:
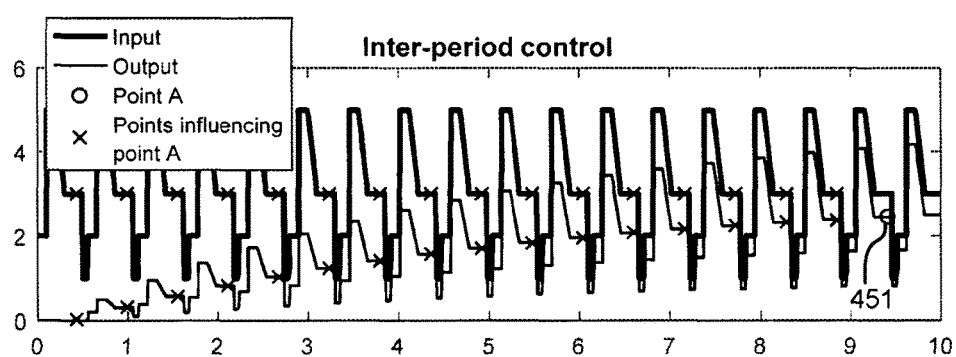
Figure 4D:
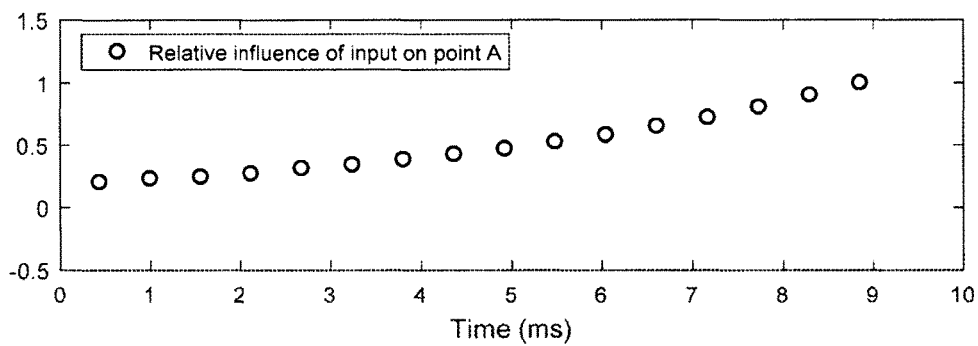

FIGS. 4A-4D show the response of an inter-period controller that may be implemented in a plasma power delivery system according to one embodiment of the present disclosure to a periodic control input. In FIGS. 4A and 4B the response 400 of the output 402 to a periodic input 401 is shown. As shown in the response 400, the output slowly converges to the input (FIG. 4A), but after about 30 cycles of the input (FIG. 4B) the output 404 follows the input 403 with almost imperceptible error. FIG. 4C shows that a point A, 451, on the response 450 and the points that influence point A. Note that for the inter-period controller point A, 451, is still significantly influenced by the input 5 ms in the past. Thus, even though each section of the output approaches the input with a time constant on the order of 5 ms, after a few periods of the input, the output can follow the input with almost imperceptible error. For the conventional intra-period controller, even with a 5 μs time constant, the output does not follow the input with this precision.

Figure 5:
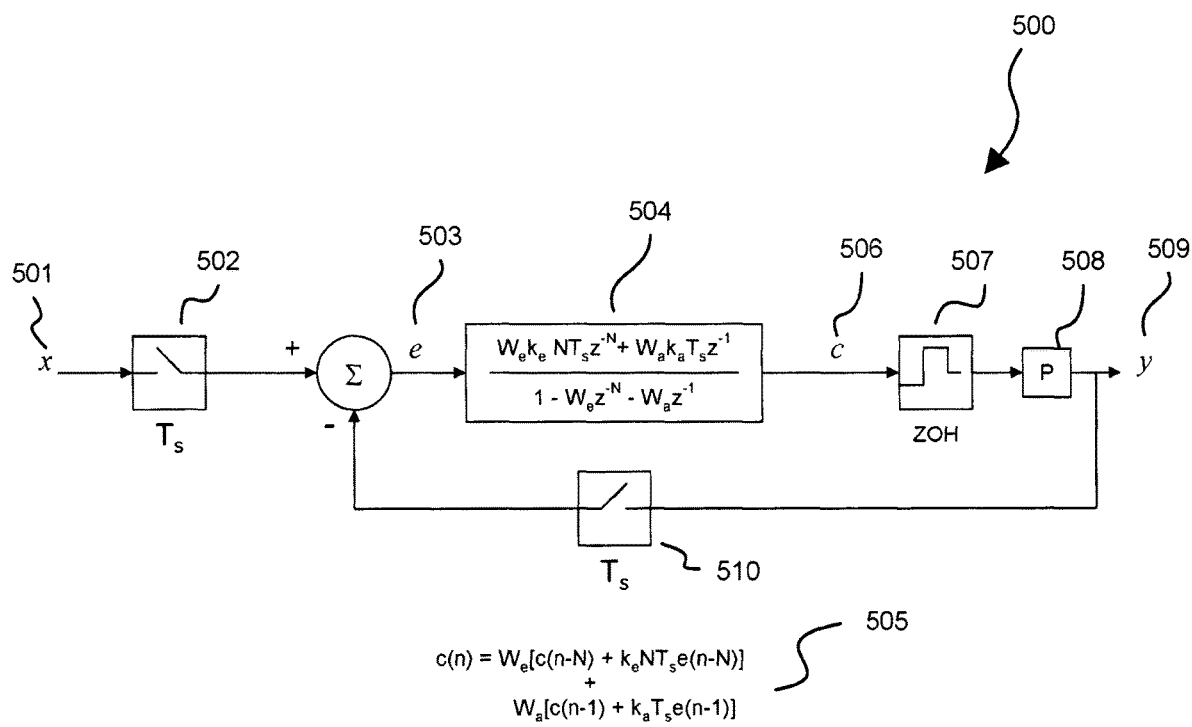
FIG. 5 illustrates a block diagram of an example combined inter-period and intra-period controller that may be implemented in a plasma power delivery system according to one embodiment of the present disclosure.

FIG. 5 illustrates a block diagram of an example combined inter-period and intra-period controller 500 that may be implemented in a plasma power delivery system according to one embodiment of the present disclosure. The input, 501, is sampled and digitized by an analog to digital converter, 502, at a sampling rate of $1/T_s$. (The input may already exist as a data stream in which case the converter 502 is not used.) The output 509 is sampled and digitized by an analog to digital converter 510. (The output may be a digital data stream derived from a measurement of the output in which case the analog to digital converter may not be implemented as shown.) An error function 503 is obtained by subtracting the input from the output. The controller 504 generates the control input to the plant, c, 506, from the values of the control input to the plant, c, 506, and the error function, e, 503, one period of the input, $T_p$, ago and one sampling period, $T_s$, ago. N and $T_s$ are chosen to satisfy $T_p=NT_s$. The control input, c, 506, is a weighted average of a value based on values one sampling period, $T_s$, ago and one period of the input, $T_p$, ago. This weighting is perhaps more clearly illustrated in the sequence (sampled time) domain shown in equation 505. In 504 and 505, $W_e$ is a real number between 0 and 1 and $W_a=1-W_e$. If $W_e=1$, the controller is a pure inter-period controller and if $W_e=0$ the controller is a conventional intra-period controller. The control input to the plant, c, 506, is converted to an analog signal by a digital to analog converter, 507, and applied to a plant, 508. Provision can be made to deal with situations where the repetition period of the input, $T_p$, may vary a few sampling periods. In this case, N is allowed to vary based on the number of sampling periods, $T_s$, that fit in the previous period of the input, $T_p$. In this case, if a section towards the end of the repetition was not recently updated, rather than copying the state from a prior sample, the weighting can be changed to run a pure intra-period controller ($W_e=0$) until the start of the next period of the input. This example combined inter-period and intra-period controller 500 has the additional advantage that it can easily transition from operating with a periodic input to operating with a non-repetitive input, 501.

Figure 6A:
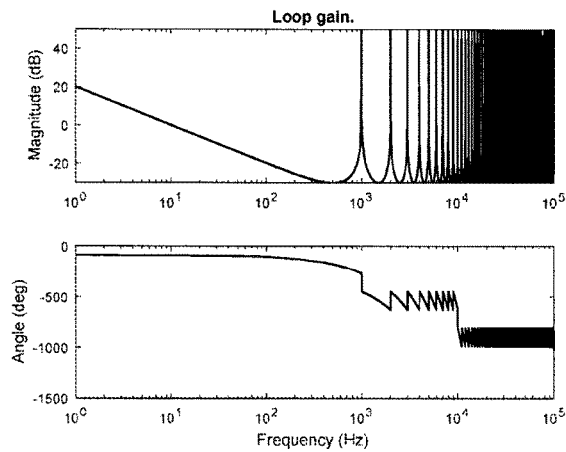
FIG. 6A illustrates the loop gain as a function of frequency of an example pure inter-period controller.
Figure 6B:
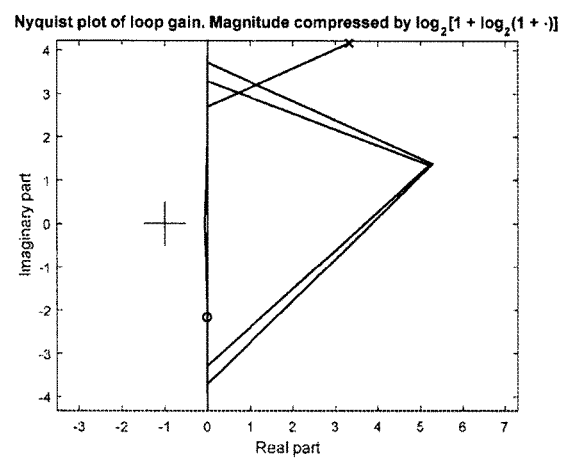
FIG. 6B illustrates the Nyquist plot of the loop gain for the inter-period controller generating the loop gain of FIG. 6A.
Figure 6C:
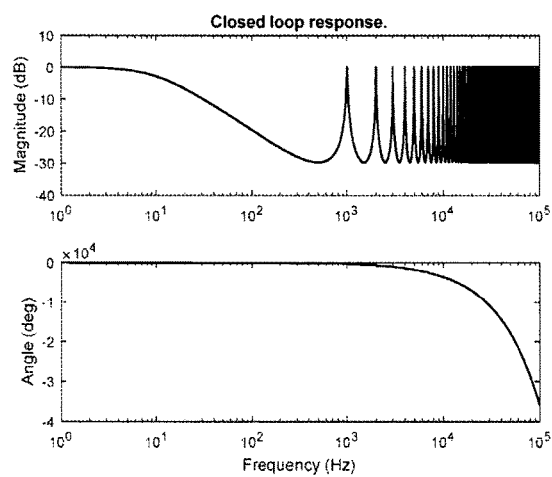
FIG. 6C illustrates the closed loop response as a function of frequency for the inter-period controller generating the loop gain of FIG. 6A.
Figure 6D:
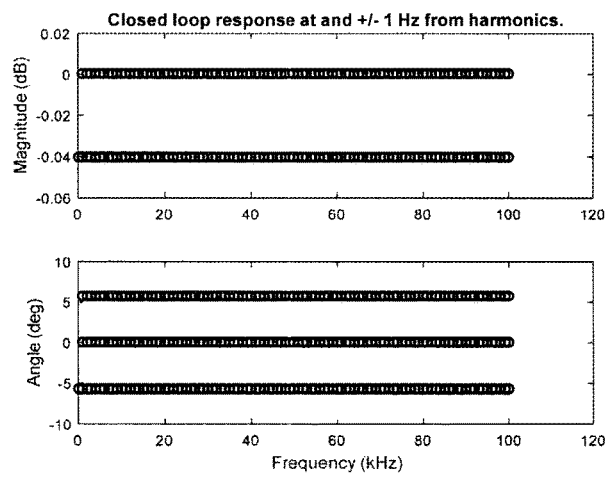
FIG. 6D illustrates the closed loop response as a function of frequency at and close to the harmonics of the input waveform for the pure inter-period controller.

FIG. 6A, FIG. 6B, FIG. 6C and FIG. 6D illustrate properties of an example inter-period controller such as 300, 350 or 500 (with $W_e=1$) that may be implemented in a plasma power delivery system according to one embodiment of the present disclosure. For ease of illustration, in FIG. 6 the plant, P, 308, 357 or 506 is a simple unity gain block, the sample period $T_s=1$ µs, the repetition period $T_p=1$ ms, and hence N=Tp/Ts=1000, and k ($k_e$ in 500)=62.83 The Bode plot of the loop gain of an inter-period controller is shown in FIG. 6A. The loop gain is very different from a traditional intra-period controller. There is a first gain cross over frequency at 10 Hz as may be expected for a gain, k ($k_e$ in 500)=62.83=2π10, but the magnitude of the gain returns to infinity at the harmonics of the input (multiples of $1/T_p$); a unique property of the inter-period controller that allows it to follow a periodic input with unprecedented precision. FIG. 6B shows a Nyquist plot of the loop gain. To facilitate interpretation of the Nyquist plot, the magnitude of the loop gain is scaled by $\log_2(1+\log_2(1+●))$. This mapping maps 0 to 0, 1 to 1 and is monotonically increasing so we can still verify that the point −1+j0 in the complex plane is not encircled. Despite the multiple gain crossings in the Bode plot, the Nyquist plot shows that the system is stable. FIG. 6C shows the magnitude and phase of the closed loop response of the system. FIG. 6D shows the magnitude and phase of the closed loop response of the system only at the harmonics of the input and +/−1 Hz from the harmonics of the input. FIG. 6D shows that the gain at the harmonics is unity gain confirming that a periodic input with period $T_p$ will be followed with precision. In FIG. 6D the points that have exactly 0 dB gain and 0 phase (unity gain) are exactly at the harmonics of the input, points having a gain of −0.04 dB and phase of +/−5 degrees are 1 Hz above and below the harmonic of the input.

Figure 7A:
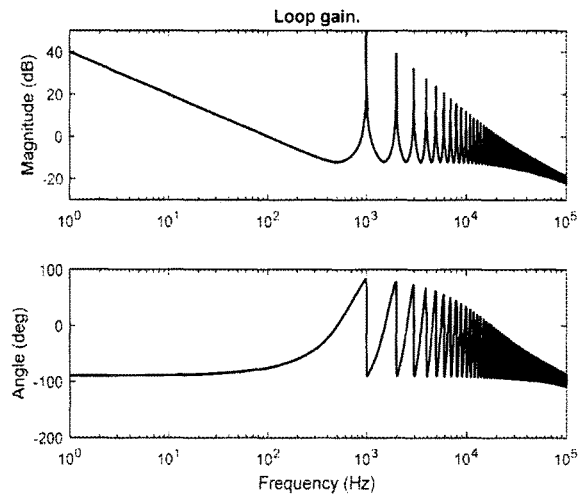
FIG. 7A illustrates the loop gain as a function of frequency of an example combined inter-period and intra-period controller with a 0.1 weighting for the inter-period part and a 0.9 weighting for the intra-period part.
Figure 7B:
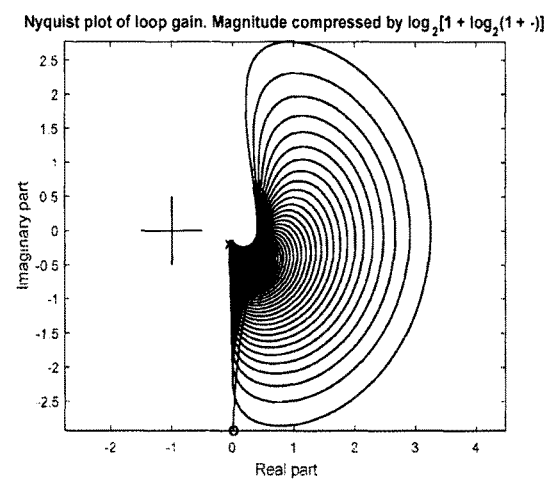
FIG. 7B illustrates the Nyquist plot of the loop gain related to FIG. 7A.
Figure 7C:
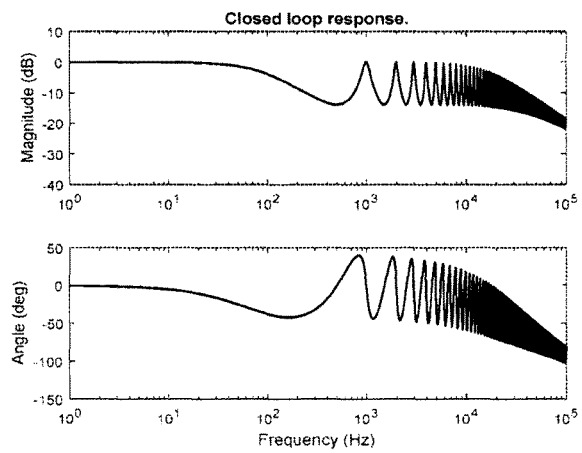
FIG. 7C illustrates the closed loop response as a function of frequency of the example combined controller related to FIG. 7A.
Figure 7D:
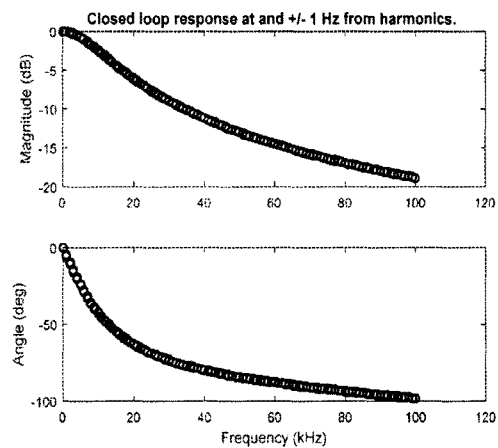
FIG. 7D illustrates the closed loop response as a function of frequency at and close to the harmonics of the input waveform for the combined inter-period and intra-period controller related to FIG. 7A.

FIG. 7A, FIG. 7B, FIG. 7C and FIG. 7D illustrate properties of an example combined inter-period controller and intra-period controller 500 with $W_e=0.1$ that may be implemented in a plasma power delivery system according to one embodiment of the present disclosure. For ease of illustration, in FIG. 7 the plant, P, 506 is a simple unity gain block, the sample period $T_s=1$ µs the repetition period $T_p=1$ ms, and hence N=Tp/Ts=1000, $k_e=62.83$, and $k_a=62830$. The Bode plot of the loop gain of the combined inter-period and intra-period controller is shown in FIG. 7A. The loop gain is very different from a traditional intra-period controller. There is a first gain cross over frequency at 100 Hz, which is between the cross over frequency for $W_e=1$ of 10 Hz, and the cross over for $W_e=0$ of 10 kHz. The magnitude of the gain returns to high but finite values at the harmonics of the input (multiples of $1/T_p$); a unique property of the combined inter-period and intra-period controller. FIG. 7B shows a Nyquist plot of the loop gain. To facilitate interpretation of the Nyquist plot, the magnitude of the loop gain is scaled by $\log_2(1+\log_2(1+●))$. This mapping maps 0 to 0, 1 to 1 and is monotonic increasing so we can still verify that the point −1+j0 in the complex plane is not encircled. Despite the multiple gain crossings in the Bode plot, the Nyquist plot shows that the system is stable. FIG. 7C shows the magnitude and phase of the closed loop response of the system. FIG. 7D shows the magnitude and phase of the closed loop response of the system only at the harmonics of the input and +/−1 Hz from the harmonics of the input. FIG. 7D shows that the gain at the first few harmonics of the input is close to unity gain showing that the first few harmonic components of the input will be followed with good precision.

Figure 8A:
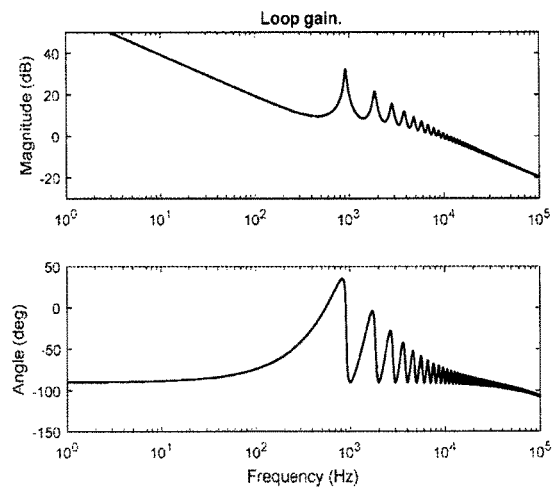
FIG. 8A illustrates the loop gain as a function of frequency of an example combined inter-period and intra-period controller with a 0.01 weighting for the inter-period part and a 0.99 weighting for the intra-period part.
Figure 8B:
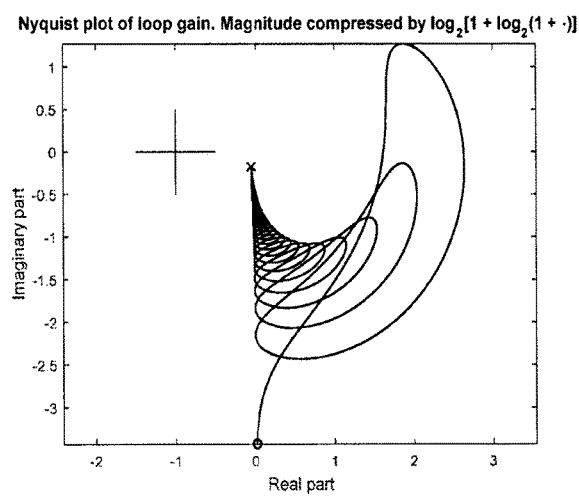
FIG. 8B illustrates the Nyquist plot of the loop gain for the combined controller related to FIG. 8A.
Figure 8C:
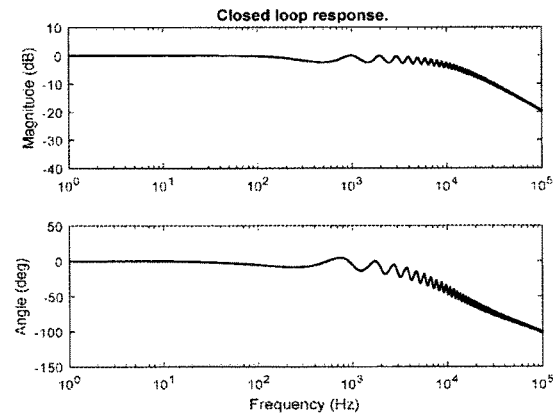
FIG. 8C illustrates the closed loop response as a function of frequency for the combined controller related to FIG. 8A.
Figure 8D:
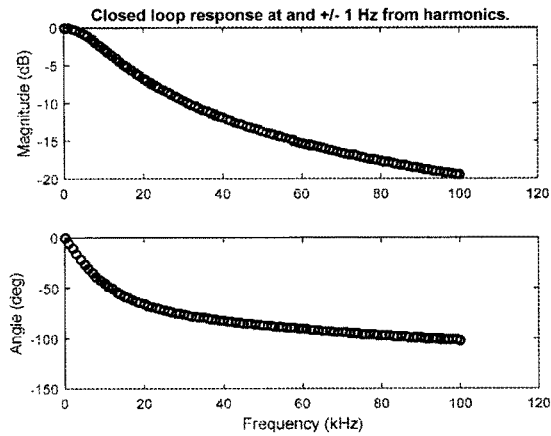
FIG. 8D illustrates the closed loop response as a function of frequency at and close to the harmonics of the input waveform for the same combined inter-period and intra-period controller related to FIG. 8A.

FIG. 8A, FIG. 8B, FIG. 8C and FIG. 8D illustrate properties of an example combined inter-period controller and intra-period controller 500 with $W_e=0.01$ that may be implemented in a plasma power delivery system according to one embodiment of the present disclosure. In FIG. 8 the plant, P, 506 is a simple unity gain block, the sample period $T_s=1$ the repetition period $T_p=1$ ms, and hence N=Tp/Ts=1000, $k_e=62.83$, and $k_a=62830$. The Bode plot of the loop gain of the combined inter-period and intra-period controller is shown in FIG. 8A. The loop gain approaches that of a traditional intra-period controller. There is a first gain cross over frequency at 9.1 kHz, which is between the cross over frequency for $W_e=1$ of 10 Hz, and the cross over for $W_e=0$ of 10 kHz. The magnitude of the gain returns to values higher than unity two more times as the frequency increases. FIG. 8B shows a Nyquist plot of the loop gain. To facilitate interpretation of the Nyquist plot, the magnitude of the loop gain is scaled by $\log_2(1+\log_2(1+●))$. This mapping maps 0 to 0, 1 to 1 and is monotonic increasing so we can still verify that the point −1+j0 in the complex plane is not encircled. Despite the multiple gain crossings in the Bode plot, the Nyquist plot shows that the system is stable. FIG. 8C shows the magnitude and phase of the closed loop response of the system. FIG. 7D shows the magnitude and phase of the closed loop response of the system only at the harmonics of the input and +/−1 Hz from the harmonics of the input. FIG. 7D shows that the gain at the first few harmonics of the input is close to unity gain showing that the first few harmonic components of the input will be followed with good precision. This controller approaches the performance of an intra-period controller with a gain cross over frequency of 10 kHz.

Figure 9:
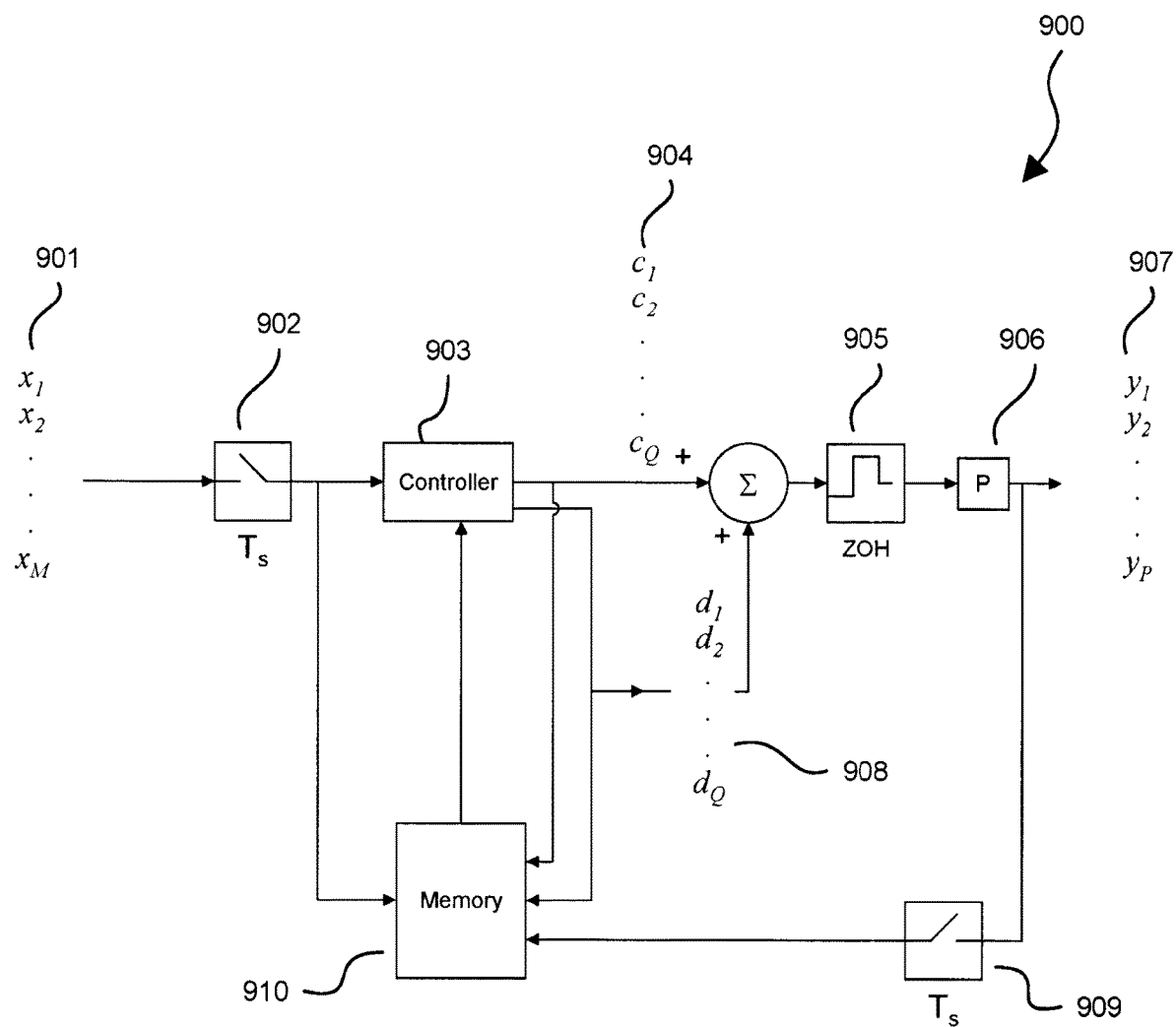
FIG. 9 illustrates a block diagram of a multi-input multi-output version of a combined inter-period and intra-period controller according to one embodiment of the present disclosure.

FIG. 9 illustrates a block diagram of a multi-input multi-output version of an example combined inter-period and intra-period controller 900 that may be implemented in a plasma power delivery system according to one embodiment of the present disclosure. The input, 901, is sampled and digitized by analog to digital converters, 902, at a sampling rate of $1/T_s$. (The input may already exist as a data stream in which case the converters 902 are not used.) The input is multi-dimensional and may, for example, contain inputs for output power and generator source impedance. The output 907 is sampled and digitized by analog to digital converters 909. (The output may be a digital data stream derived from a measurement of the output in which case the analog to digital converters may not be implemented as shown). The output is multi-dimensional and may, for example, include measurements of output power and impedance presented to the generator. The dimensionality of the input 901 and output 907 do not have to agree. This is so because an element of the output may contain a measure of something that is being minimized or maximized and thus does not require an input (e.g., the mismatch of the load impedance presented to the generator to a desired load impedance). Also, an element of the input may not require a corresponding measurement if the value can simply be set and does not require a corresponding measurement (e.g., setting the generator source impedance). Measurements of the input 901, control input 904, perturbation 908, and output 907 are stored in a memory 910. The controller 903 generates the control input to the plant, c, 904, from the values stored in memory, one period of the input, $T_p$, ago and one sampling period, $T_s$, ago. N and $T_s$ are chosen to satisfy $T_p=NT_s$.

In addition to calculating values of the control input to the plant, 904, the controller can also generate a perturbation 908 that is added to the calculated control. The control input 904 to the plant added to the perturbation 908 is converted to an analog signals by digital to analog converters, 905, and applied to a plant, 906. Perturbations 908 can be used to extract correlations between the control input 904 and output 907. For example perturbing the control element in 904 that primarily controls output power (e.g. drive level to a power amplifier) and observing the change in both output power and impedance presented to the generator by the plasma load and then perturbing the control element that primarily controls the impedance presented to the generator (e.g. generator frequency) and observing both output power and impedance presented to the generator by the plasma load allows the controller to extract the correlation between control inputs 904 and outputs 907. If the input is periodically modulated, the correlation between control inputs 904 and outputs 907 are also modulated (assuming the load is nonlinear as is the case for most plasma loads). An inter-period controller can correlate control inputs 904 and outputs 907 for each specific time period in the repetitive input cycle. For example, for $T_p=1$ ms and $T_s=1$ µs the controller can maintain 1000 matrices correlating 904 with 907 for each of the 1000 time periods in the input. In addition to extracting correlation between elements of the control input 904 and elements of the output 907 for each specific time period, correlation can be extracted between different time periods. For example, the controller can determine how a change in an element of the control input in one time period affects the output in successive time periods.

A simple example illustrates the advantage of knowing these correlations. Consider the decision on how to update a two-dimensional control vector (e.g. drive and frequency) and a two dimensional output (e.g. output power and load resistance) for the $7^{th}$ time period in the periodic input. Let the desired change in the outputs of the $7^{th}$ time period be:

$$\begin{bmatrix} \Delta y_1(7) \\ \Delta y_2(7) \end{bmatrix}$$

Assuming that through perturbation the correlation between the outputs in the $7^{th}$ time period and the control inputs in the $6^{th}$ and $7^{th}$ time periods are estimated:

$$\begin{bmatrix} \frac{\partial y_1(7)}{\partial c_1(7)} & \frac{\partial y_1(7)}{\partial c_2(7)} & \frac{\partial y_1(7)}{\partial c_1(6)} & \frac{\partial y_1(7)}{\partial c_2(6)} \\ \frac{\partial y_1(7)}{\partial c_1(7)} & \frac{\partial y_1(7)}{\partial c_2(7)} & \frac{\partial y_1(7)}{\partial c_1(6)} & \frac{\partial y_1(7)}{\partial c_2(6)} \end{bmatrix}$$

It follows that (approximately):

$$\begin{bmatrix} \Delta y_1(7) \\ \Delta y_2(7) \end{bmatrix} = \begin{bmatrix} \frac{\partial y_1(7)}{\partial c_1(7)} & \frac{\partial y_1(7)}{\partial c_2(7)} \\ \frac{\partial y_1(7)}{\partial c_1(7)} & \frac{\partial y_1(7)}{\partial c_2(7)} \end{bmatrix} \begin{bmatrix} \Delta c_1(7) \\ \Delta c_2(7) \end{bmatrix} + \begin{bmatrix} \frac{\partial y_1(7)}{\partial c_1(6)} & \frac{\partial y_1(7)}{\partial c_2(6)} \\ \frac{\partial y_1(7)}{\partial c_1(6)} & \frac{\partial y_1(7)}{\partial c_2(6)} \end{bmatrix} \begin{bmatrix} \Delta c_1(6) \\ \Delta c_2(6) \end{bmatrix}$$

When the inputs for the $7^{th}$ time period need to be adjusted, the changes to the inputs of the $6^{th}$ time period have already been made, thus:

$$\begin{bmatrix} \Delta c_1(6) \\ \Delta c_2(6) \end{bmatrix}$$

is known and it follows that:

$$\begin{bmatrix} \Delta c_1(7) \\ \Delta c_2(7) \end{bmatrix} = \begin{bmatrix} \frac{\partial y_1(7)}{\partial c_1(7)} & \frac{\partial y_1(7)}{\partial c_2(7)} \\ \frac{\partial y_1(7)}{\partial c_1(7)} & \frac{\partial y_1(7)}{\partial c_2(7)} \end{bmatrix}^{-1} \left( \begin{bmatrix} \Delta y_1(7) \\ \Delta y_2(7) \end{bmatrix} - \begin{bmatrix} \frac{\partial y_1(7)}{\partial c_1(6)} & \frac{\partial y_1(7)}{\partial c_2(6)} \\ \frac{\partial y_1(7)}{\partial c_1(6)} & \frac{\partial y_1(7)}{\partial c_2(6)} \end{bmatrix} \begin{bmatrix} \Delta c_1(6) \\ \Delta c_2(6) \end{bmatrix} \right)$$

The simple example uses two inputs to the plant (drive and frequency) and two outputs (output power and load resistance). Output resistance is only one component of load impedance. In a practical application it is load impedance that is important, not just the resistive part of load impedance, In such a case a third input would have to be utilized (e.g. a variable reactance element in a matching network), or optimization techniques can be employed to find the best solution using only two inputs controlling three outputs rather than the simple computations in the example.

Multi-input multi-output control in conjunction with inter-period control allows control of multiple parameters in one control loop. This avoids the problem of interfering control loops which normally necessitates using widely differing speeds for different control loops in the same plasma power delivery system.

Inter-period control allows for a single controller to more readily control multiple generators delivering power to the same plasma system. The data rate for inter-period and intra-period controllers are the same since the control input to the plant is updated at the sampling rate $1/T_s$. However, the intra-period controller needs information from one sampling period $T_s$ earlier to update a current control input to a plant whereas the inter-period controller needs information from one input period $T_p$ earlier to update a control input to a plant. Since in most cases $T_p$ is multiple times longer than $T_s$, it is much easier to get information to and from a controller before that information is needed for the inter-period controller. Inter-period controllers can thus much more readily take interactions between different generators into account to improve overall control of all generators delivering power to the same plasma system.

In the given examples of inter-period and mixed inter-period and intra-period controllers, the controllers used samples of signals one sampling period, $T_s$, or one repetition period, $T_p$, in the past. Of course the controller can also use samples of signals multiple sampling periods or repetition periods in the past.

What is claimed is:

1. A power delivery system comprising:
   a generator configured to produce a power signal comprising a periodic repeating pattern produced over a period of time comprising a period of the power signal; and
   a controller configured to control a current period of the periodic repeating pattern based on a measurement of the periodic repeating pattern taken in a period of the power signal prior to a current period of the power signal and a plurality of correlations between elements of multi-dimensional control input values to elements of multi-dimensional output values.

2. The power delivery system of claim 1 wherein: the controller is configured to control the periodic repeating pattern based on the measurement of the periodic repeating pattern taken in a period prior to the current period combined with a measurement of the periodic repeating pattern during a current period.

3. The power delivery system of claim 1 wherein the generator is configured to produce the periodic repeating pattern with a prescribed pattern wherein the prescribed pattern repeats with a repetition period, and wherein the measurement of the periodic repeating pattern taken in a period prior to the current period occurs one or more repetition periods in the past.

4. The power delivery system of claim 3 wherein the controller is configured to determine and use the correlations between the elements of the multi-dimensional control input values for a specific time period in the periodic repeating pattern and the elements of the multi-dimensional output values for the same specific time period.

5. The power delivery system of claim 4 wherein the controller is configured to perturb the control input to obtain the correlations between the elements of the multi-dimensional control input values and the elements of the multi-dimensional output values.

6. The power delivery system of claim 4 wherein the correlations between the elements of the multi-dimensional control input values for a specific time period in the periodic repeating pattern and time periods adjacent to the specific time period and the elements of the multi-dimensional output values for the specific time period is determined and used by the controller.

7. The power delivery system of claim 6 where the correlations between the elements of the multi-dimensional control input values and the elements of the multi-dimensional output values are determined by perturbing the control input and observing response to the perturbation.

8. The power delivery system of claim 6 where one element of the periodic repeating pattern is one of voltage, current and power or combinations thereof and another element of the periodic repeating pattern is one of impedance presented to the generator and source impedance of the generator.

9. The power delivery system of claim 4 wherein one element of the periodic repeating pattern is one of voltage, current and power or combinations thereof and another element of the periodic repeating pattern is one of impedance presented to the generator and source impedance of the generator.

10. The power delivery system of claim 1 wherein the generator is one of a single radio frequency generator or a direct current generator, and the periodic repeating pattern is at least one of voltage, current, and power.

11. The power delivery system of claim 1 wherein the generator comprises a plurality of radio frequency generators, or a plurality of direct current generators, or a combination of radio frequency generators and direct current generators, and the periodic repeating pattern is at least one of voltage, current and power delivered to a plasma system.

12. A power delivery system comprising: a control system; and a memory in communication with the control system; wherein the control system is configured to: produce an output signal that repeats with a repetition period; store measurements of the output signal; produce and store a plurality of correlations between elements of multi-dimensional control input values to elements of multi-dimensional output values; control the repetitions based on the stored measurements of the output signal taken from one or more previous repetition periods and the plurality of correlations between elements of multi-dimensional control input values to elements of multi-dimensional output values.

13. The power delivery system of claim 12, wherein the control system is configured to combine measurements taken from one or more previous repetition periods with measurements taken from a current repetition period.

14. The power delivery system of claim 12, wherein the control system is configured to produce and use the correlations between the plurality of control input elements of the multi-dimensional control input values at one instant of time relative to a start of the repetition period and a plurality of output elements of the multi-dimensional output values at the same instant of time relative to the start of the repetition period.

15. The power delivery system of claim 14, wherein the control system is configured to perturb the control input and measure a response to the perturbation to produce the correlations between the control input elements of the multi-dimensional control input values and the output elements of the multi-dimensional output values.

16. The power delivery system of claim 14, wherein the control system is configured to determine and use the correlations between the plurality of control input elements of the multi-dimensional control input values at one instant of time relative to the start of the repetition period and at instances of time adjacent to the one instant of time and the output elements of the multi-dimensional output values at the one instant of time relative to the start of the repetition period.

17. The power delivery system of claim 16, wherein the control system is configured to produce the correlations between the control input elements of the multi-dimensional control input values and the output elements of the multi-dimensional output values by perturbing the control input and measuring a response to the perturbation.

18. The power delivery system of claim 16, wherein one output element of the output comprises at least one of a voltage, a current, and a power level, wherein another output element of the output comprises at least one of a load impedance presented to a generator and a source impedance of the generator.

19. The power delivery system of claim 14, wherein one of the output elements of the output comprises at least one of a voltage, a current, and a power, wherein another output element of the output comprises at least one of a load impedance presented to a generator and a source impedance of the generator.

20. The power delivery system of claim 12, wherein the power delivery system comprises a single radio frequency (RF) or direct current (DC) generator and an element of the output comprises at least one of a voltage, a current, and a power level delivered to a plasma system.

21. The power delivery system of claim 12, wherein the power delivery system comprises a plurality of generators each comprising a RF generator, a DC generator, or a combination of RF and DC generators and an element of each of an output of the plurality of generators comprises at least one of a voltage, a current, and a power level.

22. A plasma power delivery system comprising: a plasma processing chamber to contain a plasma; a generator that produces a power signal that modulates plasma properties of the plasma with a periodic modulation pattern that repeats with a repetition period; an impedance matching network coupled to the plasma processing chamber and the generator; and control means operably coupled to the impedance matching network, the control means comprising means for controlling a variable impedance element in the impedance matching network based on a measurement indicative of a load impedance taken from one or more repetition periods of the periodic modulation pattern in the past and a plurality of correlations between elements of multi-dimensional control input values to elements of multi-dimensional output values.

23. The plasma power delivery system of claim 22 wherein the control means comprises means for controlling the variable impedance element in the impedance matching network based on the measurement indicative of the load impedance taken from one or more repetition periods of the periodic modulation pattern in the past combined with a measurement indicative of the load impedance taken less than a repetition period of the periodic modulation pattern in the past.

* * * * *